United States Patent
Sun (10) Patent No.: US 8,319,568 B2
(45) Date of Patent: Nov. 27, 2012

(54) METHOD OF COMPENSATING AN OSCILLATION FREQUENCY AND PLL

(75) Inventor: Hongquan Sun, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/282,151

(22) Filed: Oct. 26, 2011

(65) Prior Publication Data

US 2012/0038401 A1    Feb. 16, 2012

Related U.S. Application Data

(63) Continuation of application No. 12/692,710, filed on Jan. 25, 2010, now Pat. No. 8,072,282.

(30) Foreign Application Priority Data

Feb. 20, 2009    (CN) .......................... 2009 1 0008298

(51) Int. Cl.
*H03B 5/04* (2006.01)

(52) U.S. Cl. .......................... 331/176; 331/185; 331/186

(58) Field of Classification Search .................. 331/176, 331/177 V, 185, 186
See application file for complete search history.

(56) References Cited

U.S. PATENT DOCUMENTS

| | | | |
|---|---|---|---|
| 6,462,625 B2 * | 10/2002 | Kim | 331/57 |
| 7,164,325 B2 | 1/2007 | Aparin | |
| 7,268,636 B2 | 9/2007 | Takeuchi et al. | |
| 7,391,274 B2 | 6/2008 | Hsu | |
| 2006/0012445 A1 | 1/2006 | Takeuchi et al. | |

FOREIGN PATENT DOCUMENTS

| | | |
|---|---|---|
| CN | 1031895 A | 3/1989 |
| CN | 1722608 A | 1/2006 |
| JP | 2008-211763 | 9/2008 |

OTHER PUBLICATIONS

First Office Action in Chinese Application No. 20091008298.X, mailed Jun. 24, 2010.
Office Action issued in corresponding Chinese Patent Application No. 200910008298.X, mailed Nov. 1, 2011.

* cited by examiner

*Primary Examiner* — Joseph Chang
(74) *Attorney, Agent, or Firm* — Brinks Hofer Gilson & Lione (57) ABSTRACT

A method for compensating an oscillation frequency, a device, and a phase locked loop (PLL) is applied in the LC oscillating loop, including: sending voltage control signals to one end of a variable capacitor of an LC oscillating loop to generate oscillating signals in the LC oscillating loop through the voltage control signals; obtaining variable bias voltage that reflects changes of external parameters; and sending the variable bias voltage to the other end of the variable capacitor to compensate changes to the oscillation frequency of oscillation signals generated in the LC oscillating loop. This disclosure compensates the changes to the oscillation frequency of the circuit that contains the LC oscillating loop and improves the stability of the circuit oscillation frequency by sending bias voltage to one end of the variable capacitor of the LC oscillating loop.

4 Claims, 8 Drawing Sheets

METHOD OF COMPENSATING AN OSCILLATION FREQUENCY AND PLL

CROSS-REFERENCE TO RELATED APPLICATIONS

This application is a continuation of U.S. patent application Ser. No. 12/692,710, filed on Jan. 25, 2010, which claims priority to Chinese Patent Application No. 200910008298.X, filed on Feb. 20, 2009, all of which are hereby incorporated by reference in their entireties.

FIELD OF THE DISCLOSURE

This present disclosure is related to the circuit compensation technology field, and in particular, to a method of compensating an oscillation frequency, a device, and a PLL.

BACKGROUND

Figure 1:
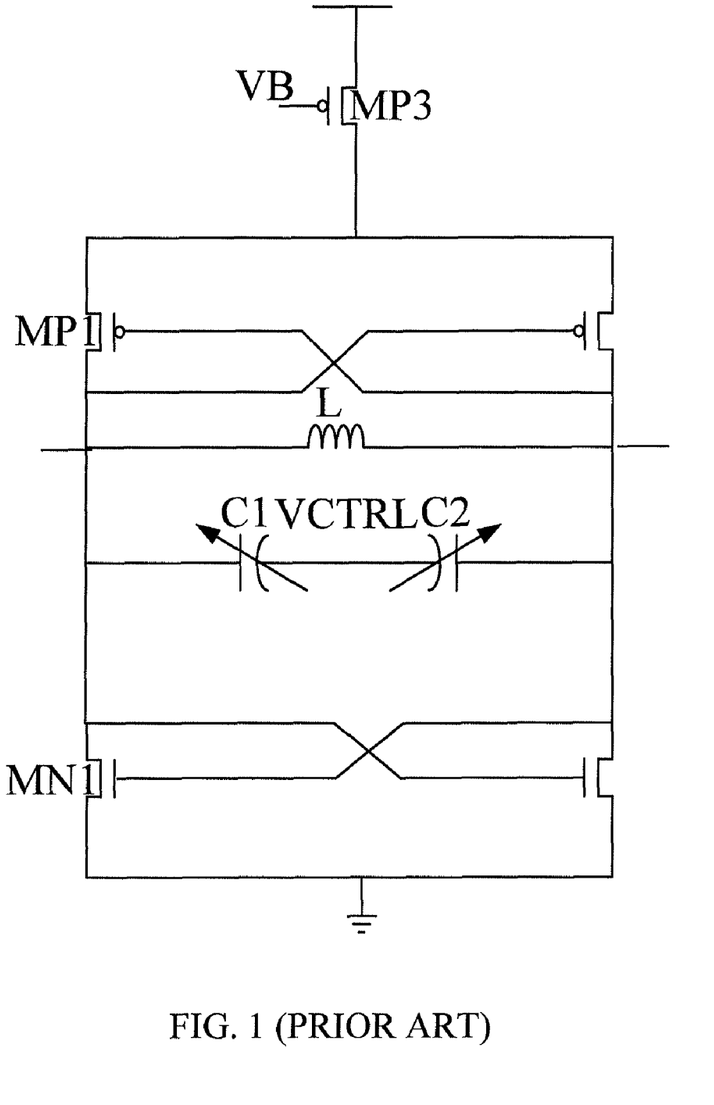
FIG. 1 shows a common chip integrated VCO circuit based on the existing technology in an embodiment of the present disclosure.

PLL is a loop control system. The phase difference between the benchmark frequency and the output frequency generates control signals for the VCO, thus regulating the output frequency to the expected value. As an important part of a PLL, a VCO is configured to generate clock signals. FIG. 1 shows a common chip integrated VCO circuit. L, C1, and C2 construct the resonance loop, whereas C1 and C2 are capacitors. MN1, MN2, and MP2 construct two pairs of negative resistance tubes. MP3 is the current source tube. MP1, MP2, and MP3 are Positive Metal Oxide Semiconductor (PMOS) tubes, while MN1 and MN2 are Negative Metal Oxide Semiconductor (NMOS) tubes. The signal input point VCTRL of the VCO is located at the middle of the distance between C1 and C2. Oscillation signals of the VCO are sent to both sides of L. The oscillation frequency of the VCO: $f=1/\sqrt{LC}$, whereas L indicates the inductance of the resonance loop, and C indicates the capacitance of the resonance loop. In the actual circuit, L and C are functions of the voltage and temperature of the power supply. That is, when the voltage and temperature of the power supply change, the oscillation frequency of the related VCO changes.

After analyzing the existing technologies, the inventor finds that the oscillation frequency of the VCO increases or decreases with the change to the voltage or temperature of the circuit in actual applications. For example, the voltage or temperature of the power supply in a system changes after the system runs for a period of time. In this case, the oscillation frequency of the VCO changes accordingly. PLL is a closed loop system. When the voltage and temperature of the power supply undergo radical changes, the oscillation frequency of the VCO varies in a broad range, and thus the PLL is out of lock. When the rate at which the voltage and temperature change is low, the negative feedback of the PLL automatically regulates the input voltage of the VCO to maintain the output frequency. In this case, however, the range of the input voltage of the VCO is enlarged, increasing the difficulty in circuit design. From another perspective, when the input voltage range of the VCO is unchanged, the oscillation frequency range of the VCO is narrowed due to impact of the voltage or temperature.

SUMMARY

A method for compensating an oscillation frequency, a device, and a PLL are provided in embodiments of the present disclosure.

A method for compensating an oscillation frequency that is applied in an LC oscillating loop, including: sending a voltage control signal to one end of a variable capacitor of the LC oscillating loop to generate oscillating signals in the LC oscillating loop according to the voltage control signals; obtaining a variable bias voltage that reflects changes of external parameters; and sending the variable bias voltage to the other end of the variable capacitor to compensate changes to the oscillation frequency of oscillation signals generated in the LC oscillating loop.

A device for compensating the oscillation frequency, including: a generating module, configured to send a voltage control signal to one end of a variable capacitor of an LC oscillating loop to generate oscillating signals in the LC oscillating loop; and an obtaining module, configured to: obtain a variable bias voltage that reflects changes of external parameters, and send the variable bias voltage to the other end of the variable capacitor to compensate changes to the oscillation frequency of oscillation signals generated in the LC oscillating loop.

A Phase Locked Loop, for compensating the oscillation frequency, including: a phase detector, a low pass filter, and a voltage controlled oscillator. The phase detector is configured to detect the phase difference between input voltage and output voltage, and convert the detected phase difference signals into a voltage signal. The low pass filter is configured to filter the voltage signal and send the filtered voltage signal to the voltage controlled oscillator as a voltage control signal. The voltage controlled oscillator includes an LC oscillating loop that includes at least one variable capacitor. The voltage control signal is sent to one end of a variable capacitor in the LC oscillating loop to generate a oscillation signal in the LC oscillating loop, and a variable bias voltage that reflects changes of external parameters is sent to the other end of the variable capacitor to compensate changes to the oscillation frequency of the oscillation signal generated by the LC oscillating loop.

This disclosure compensates the changes of the oscillation frequency of the circuit that contains the LC oscillating loop and improves the stability of the circuit oscillation frequency by sending bias voltage that reflects changes of external parameters to one end of the variable capacitor of the LC oscillating loop.

BRIEF DESCRIPTION OF THE DRAWINGS

To better illustrate the embodiments of the present disclosure by using the existing technologies, the drawings that need to be used in the present disclosure or the description of existing technologies are presented. It is understandable that the drawings merely provide several applications of the present disclosure. Those skilled in the art can obtain other drawings based on these drawings without creative work.

DETAILED DESCRIPTION

Figure 2:
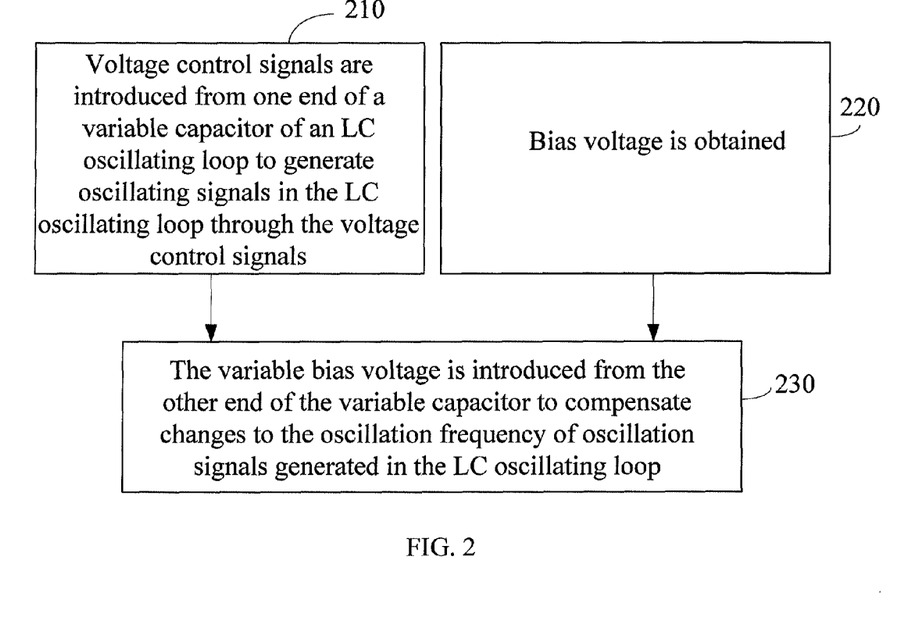
FIG. 2 is a flowchart of a method for improving circuit stability in a first embodiment of the present disclosure.

The embodiments of the present disclosure are described with reference to some accompanying drawings in the present disclosure. Although the disclosure is described through some exemplary embodiments, the disclosure is not limited to such embodiments. It is apparent that those skilled in the art can obtain other embodiments without innovative work based on the embodiments of the present disclosure. The present disclosure is intended to cover these embodiments provided that they fall in the scope of protection defined in the present disclosure. FIG. 2 is a flowchart for a method for compensating an oscillation frequency that is applied in an LC oscillating loop is provided in an embodiment of the present disclosure. The flowchart includes:

Step 210: Voltage control signals are sent to one end of a variable capacitor of an LC oscillating loop to generate oscillating signals in the LC oscillating loop through the voltage control signals.

Step 220: Variable bias voltage that reflects changes of external parameters is obtained.

Step 230: The variable bias voltage is sent to the other end of the variable capacitor to compensate changes to the oscillation frequency of oscillation signals generated in the LC oscillating loop.

This disclosure compensates the changes to the oscillation frequency of the circuit that contains the LC oscillating loop and improves the stability of the circuit oscillation frequency by sending bias voltage that reflects changes of external parameters to one end of the variable capacitor of the LC oscillating loop.

The second embodiment illustrates how to compensate the oscillation frequency of the VCO circuit on the basis of the first embodiment.

The oscillation frequency of the VCO varies with external parameters, such as voltage and temperature of the circuit in actual applications. When the rate at which the voltage and temperature change is low, the negative feedback of the PLL automatically regulates the input voltage of the VCO to maintain the output frequency. In this case, however, the range of the input voltage of the VCO is enlarged. When the voltage and temperature of the power supply undergo radical changes, the PLL is easily out of lock. Therefore, it is necessary to compensate the oscillation frequency of the VCO.

Figure 3:
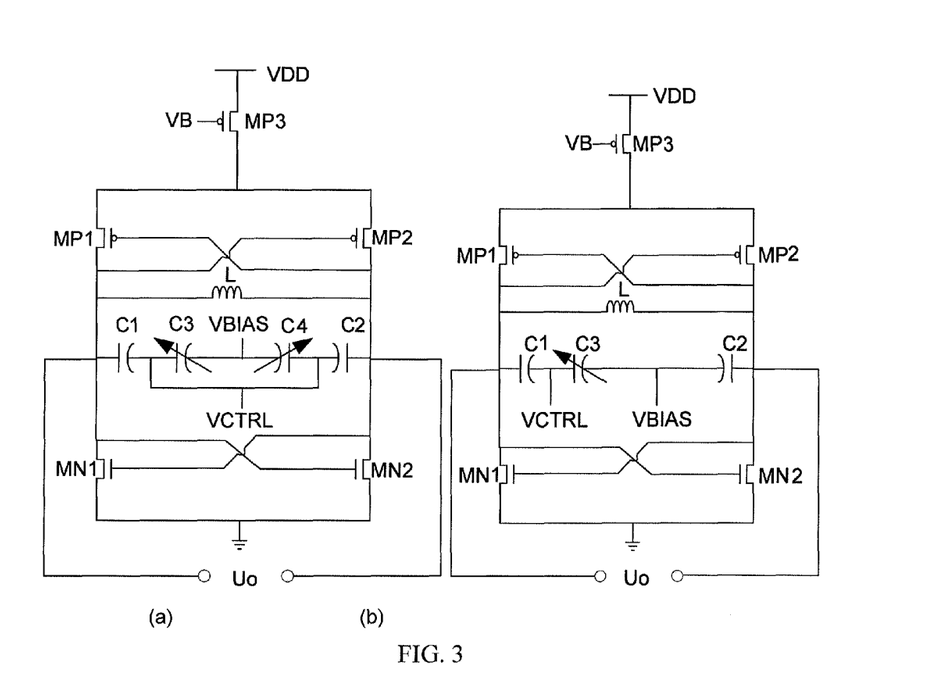
FIG. 3 shows a chip integrated VCO circuit in a second embodiment of the present disclosure.

To compensate the oscillation frequency of the VCO, in the VCO circuit in the embodiment of the present disclosure, L, C1, C2, C3, and C4 construct an LC resonance loop, as shown in FIG. 3(a), whereas C1 and C2 are fixed capacitors, C3 and C4 are variable capacitors, MN1 and MN2 construct a pair of negative resistance tubes, and MP1 and MP2 construct another pair of negative resistance tubes. This LC resonance loop is connected in parallel with the negative resistance tube of MN1 and MN2 and the negative resistance tube of MP1 and MP2. MP3 works as the current source tube. Its source is connected to the work power supply of the VCO. Its drain is connected to the source of MP1 and MP2. The source of MN1 and MN2 is grounded. Uo is the output of the VCO. The input VCTRL of the VCO is located between C1 and C2. VBIAS is configured to connect the variable bias voltage that reflects changes to external parameters to compensate changes to the oscillation frequency.

Variable capacitor C4 can be omitted in this embodiment, as shown in FIG. 3(b). In this embodiment, voltage control signal VCTRL is sent to one end of the variable capacitor C3 to generate oscillation signals in the LC oscillating loop; variable bias voltage VBIAS that reflects changes to external parameters is sent to the other end of the variable capacitor C3 to compensate changes to the oscillation frequency of the oscillation signals generated in the LC oscillating loop, that is, to compensate the oscillation frequency of the VCO.

Figure 4:
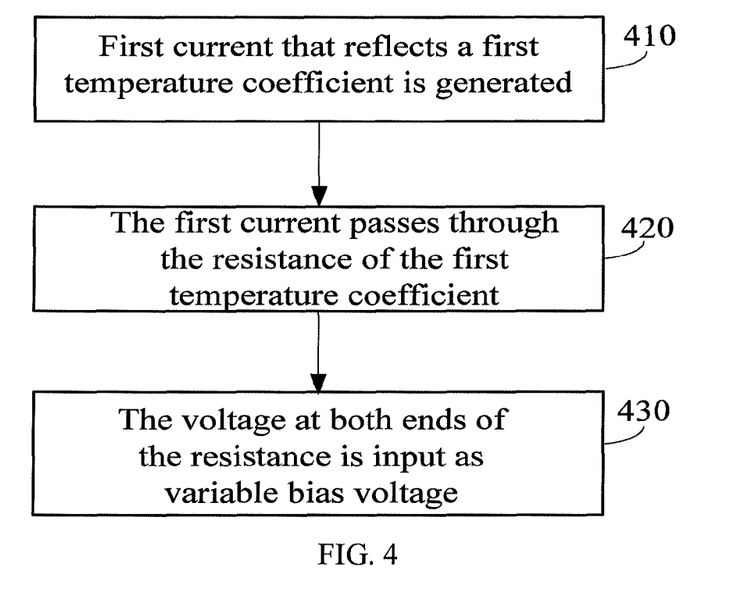
FIG. 4 is a flowchart of obtaining bias voltage in the second embodiment of the present disclosure.

Step 220, that is, the step for obtaining variable bias voltage that reflects changes to external parameters, in the first embodiment may specifically include the following sub-steps, as shown in FIG. 4:

Step 410: A first current that reflects a first temperature coefficient is generated.

Step 420: The first current passes through the resistance with the first temperature coefficient.

Step 430: The voltage at both ends of the resistance is output as variable bias voltage.

The first temperature coefficient may be a positive temperature coefficient (PTC) or a negative temperature coefficient (NTC). The resistance of a PTC increases as the temperature rises. Such a coefficient reflects the current of a PTC. The current strength increases as the temperature rises. The resistance of an NTC decreases as the temperature rises. Such a coefficient reflects the current of an NTC. The current strength decreases as the temperature rises.

Figure 5:
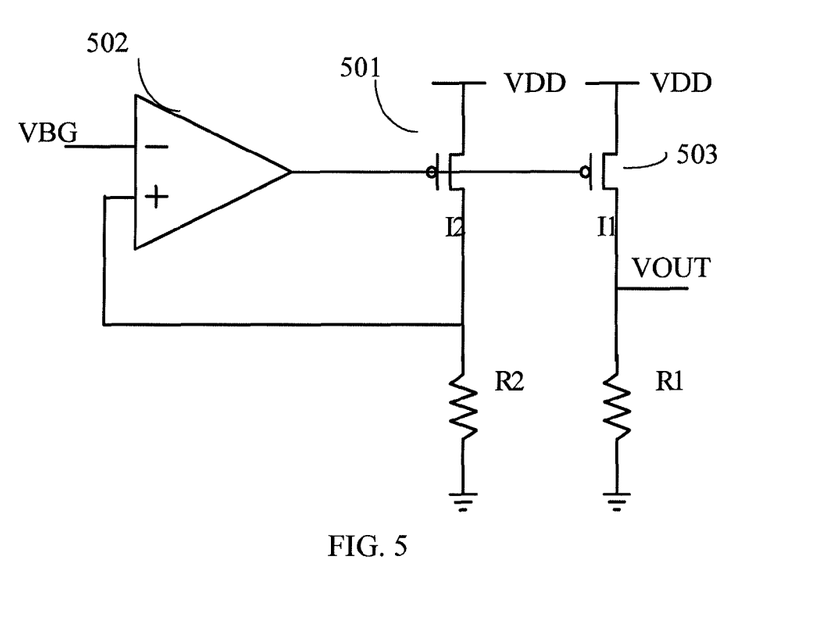
FIG. 5 shows a bias voltage generating circuit that is sensitive to temperature in the second embodiment of the present disclosure.

The variable bias voltage that reflects changes to external parameters can be obtained by the circuit shown in FIG. 5. The circuit shown in FIG. 5 includes a calculation amplifier 502, a second field effect tube 501 that is connected with the output end of the calculation amplifier 502, and a first field effect tube 503. The sources of the second field effect tube 501 and the first field effect tube 503 are connected to the second resistance and the first resistance through the direct power supply VDD, respectively. The drain of the second field effect tube 501 is connected to an input end of the calculation amplifier 502.

Figure 6:
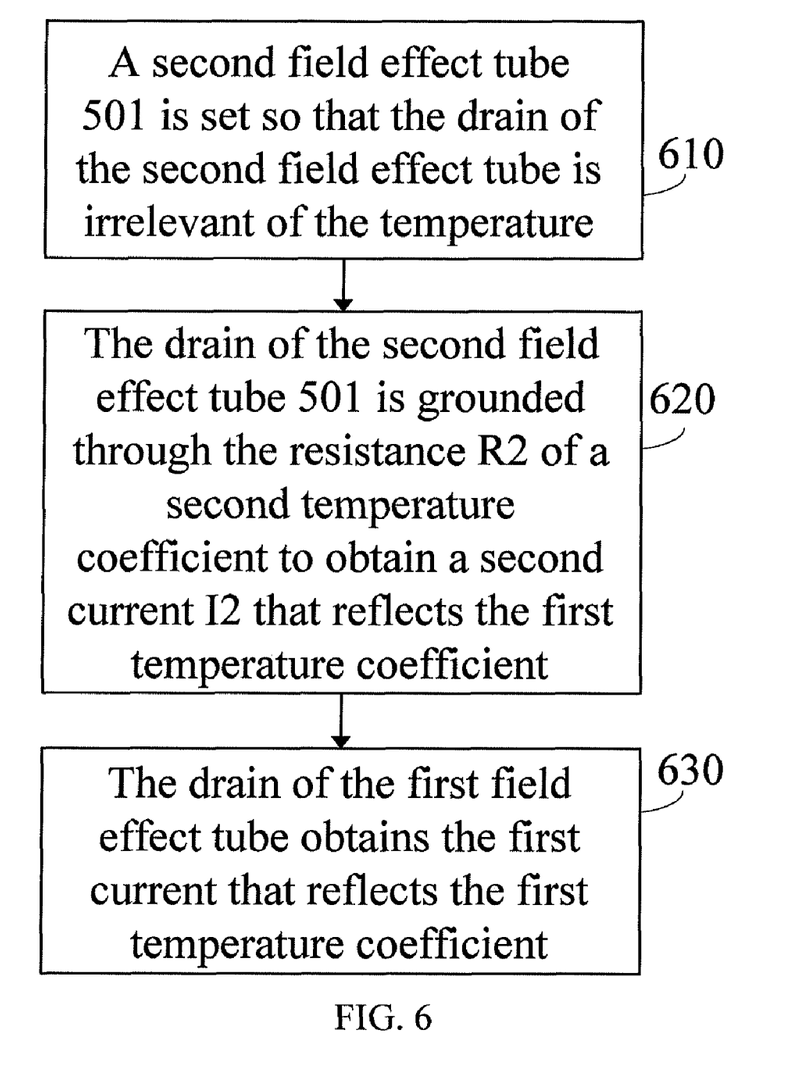
FIG. 6 is a flowchart of a method for generating a first current that reflects a first temperature coefficient in the second embodiment of the present disclosure.

Step 410 may include the following sub-steps as shown in FIG. 6:

Step 610: A second field effect tube 501 is set so that the drain of the second field effect tube is irrelevant of the temperature.

Referring to FIG. 5, the grid of the second field effect tube 501 is connected to an output end of the calculation amplifier 502. The source of the second field effect tube 501 is connected to the voltage source VDD. The drain of the second field effect tube 501 is connected to an input end of the calculation amplifier 502. In this case, a negative feedback loop is constructed. The other input end of the calculation amplifier 502 is connected to the benchmark voltage VBG that is irrelevant of the temperature. The voltage of the VBG is a constant. The VDD can be the working power supply for the VCO circuit. In this embodiment, the second field effect tube 501 is a positive field effect tube. To implement a negative feedback loop in FIG. 5, the drain of the second field effect tube 501 must be connected to the positive input end of the calculation amplifier 502. Due to the existence of this negative feedback loop, the electric potential at the positive input end is approximately the same as the electric potential at the negative input end of the calculation amplifier 502. In addition, the positive input end of 502 is directly connected to the drain of 501. Therefore, the electric potential at the drain of 501 is considered equivalent with the electric potential at the negative input end of 502. The negative input end of 502 is connected to the benchmark voltage VBG that is irrelevant of temperature. Therefore, the electric potential at the drain of the second field tube is irrelevant of temperature. If the second field effect tube 501 is a negative field effect tube (not shown in the drawing), the drain of 501 must be connected to the negative input end of the calculation amplifier 502 so that the negative field effect tube constructs a negative feedback loop with the calculation amplifier 502. The principles are the same as those in the case when 501 is a positive field effect tube, and are not repeated here.

Step 620: The drain of the second field effect tube 501 is grounded through the resistance R2 of a second temperature coefficient to obtain a second current that passes through the resistance R2 and reflects the first temperature coefficient. If the first temperature coefficient is a PTC, the second temperature coefficient is an NTC; if the first temperature coefficient is an NTC, the second temperature coefficient is a PTC.

Referring to FIG. 5, the drain of the second field effect tube 501 is grounded through the resistance R2 of a second temperature coefficient. In addition, the drain of 501 is directly connected to the positive input end of the calculation amplifier 502. The electric potential at the positive input end of 502 is approximately equivalent with that at the negative input end of 502. The voltage at both ends of R2 is VBG that is irrelevant of temperature changes. In this embodiment, the resistance R2 is the resistance of a PTC. That is, the second temperature coefficient is a PTC. The resistance of a PTC increases as the temperature rises. The voltage VBG at both ends of R2 is a constant. Therefore, the second current I2 that passes through both ends of R2 varies inversely with the strength of the resistance R2. After a period of time, when the temperature in the circuit rises, the resistance R2 of the PTC increases. Therefore, the second current I2 decreases. That is, as the temperature in the circuit rises, the second current I2 decreases. Therefore, the second current I2 has a second temperature coefficient, that is, an NTC.

Likewise, if the resistance R2 is the resistance of an NTC, the second current I2 that reflects a PTC is obtained.

Step 630: The source of the first field effect tube 503 is directly connected to the DC voltage source VDD. The grid of the first field effect tube 503 is connected to the grid of the second field effect tube 501. In this case, the drain of the first field effect tube 503 obtains a first current that reflects the first temperature coefficient. The first current varies in the same direction with the second current.

Referring to FIG. 5, the source of the first field effect tube 503 is connected to the VDD. The grid of 503 is connected to the grid of the second field effect tube 501. The grid of 503 is connected to the grid of 501 at a same electric potential. As the circuit principles state, the first current I1 obtained by the drain of 503 varies in the same direction with the second current I2. In addition, the ratio of I1 to I2 is the ratio of the size of 503 to the size of 501. The size of a field effect tube indicates the ratio of width to length of the conducting channel (W/L). Suppose that the size of 503 is W1/L1, and that the size of 501 is W2/L2. The size ratio is W1 L2/L1 W2. The second current I2 reflects the first temperature coefficient, that is, a PTC. Therefore, the first current I1 reflects the first temperature coefficient.

Likewise, if the second current I2 reflects an NTC, the first current I1 reflects an NTC.

Step 420: The first current passes through the resistance of the first temperature coefficient in the following procedure:

Referring to FIG. 5, the drain of the first field effect tube 503 is grounded through the resistance R2 of the first temperature coefficient, that is, a PTC. Therefore, the first current I1 passes through the first temperature coefficient, that is, the resistance R2 of a PTC.

Step 430: The procedure for setting the voltage at both ends of the resistance as variable bias voltage can include:

Referring to FIG. 5, the voltage VOUT at both ends of the resistance R2 of the first temperature coefficient is output as variable bias voltage. The first current I1 and resistance R2 reflect the first temperature coefficient, that is, a PTC. Therefore, the voltage VOUT at both ends of R2 reflects the first temperature coefficient, that is, a PTC.

After the variable bias voltage that reflects changes to external temperature is obtained, the temperature in the VCO circuit is compensated by using the bias voltage.

The output voltage VOUT shown in FIG. 5 is sent to the VBIAS input end of the VCO circuit shown in FIG. 3. Take FIG. 3 (a) as an example. If the voltage VCTRL at ends of variable capacitors C3 and C4 reflects a PTC, the voltage VBIAS that reflects a PTC is input to maintain the voltage at both ends of C3 and both ends of C4, thus reducing the changes to the output frequency due to impact of the temperature in the VCO circuit. Likewise, if the voltage VCTRL at ends of variable capacitors C3 and C4 reflect an NTC, a VBIAS that reflects an NTC is compensated.

The method for compensating an oscillation frequency in this embodiment can help compensate the impact of temperature changes on the oscillation frequency of the VCO and make the VCO to obtain a broad output frequency range when the input voltage range is fixed, thus improving the stability of the oscillation frequency.

The method in this embodiment is applicable to the VCO circuit and other circuits that have bias voltage input and are affected by temperature changes. This method can help improve the stability of these circuits.

Third Embodiment

This embodiment illustrates how to compensate the oscillation frequency of the VCO circuit on the basis of the first embodiment.

Figure 7:
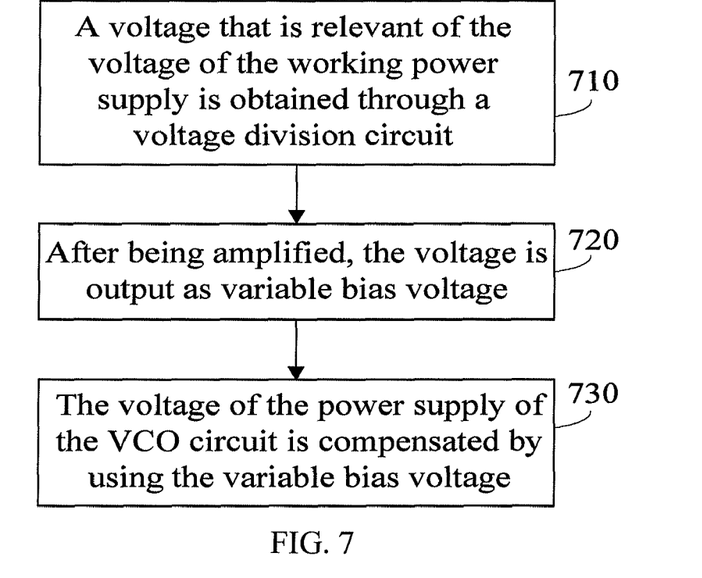
FIG. 7 is a flowchart of a method for compensating an oscillation frequency in a third embodiment of the present disclosure.

As shown in FIG. 7, in this embodiment, external parameter changes indicate changes to the voltage parameters of the power supply. The procedure for obtaining variable bias voltage that reflects external parameter changes (step 220) includes:

Step 710: A voltage that is relevant of the voltage of the working power supply is obtained according to a voltage division circuit.

Figure 8:
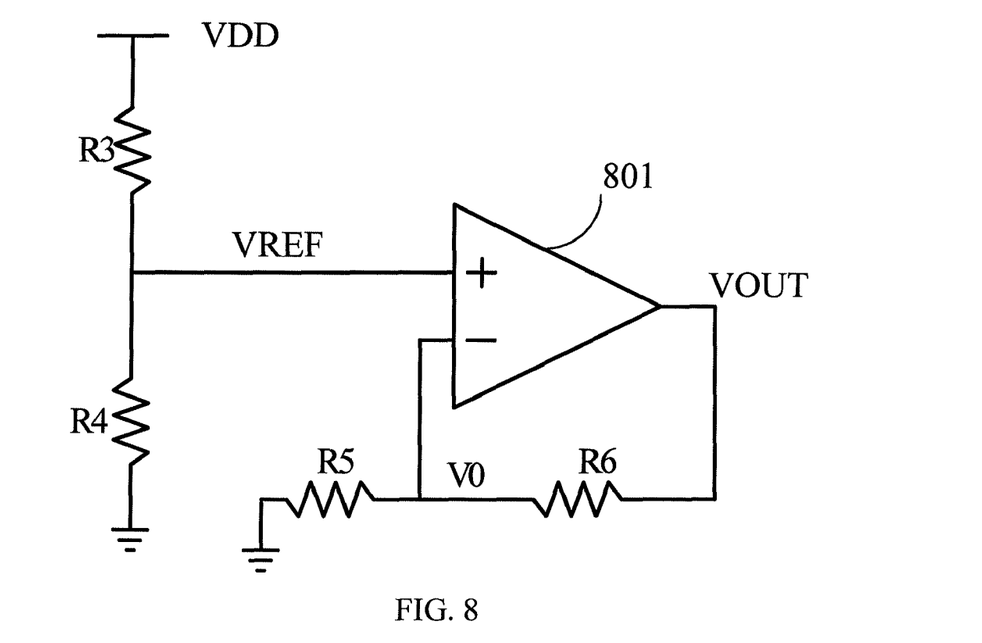
FIG. 8 shows a bias voltage generating circuit that is sensitive to voltage in the third embodiment of the present disclosure.

FIG. 8 shows a circuit that generates a bias voltage that is sensitive to the voltage of the power supply. In FIG. 8, the VDD is grounded through the resistance R3 and R4. R3 and R4 construct a voltage division circuit. Therefore, the electric potential between R3 and R4 can be calculated as follows:

$$VREF = \frac{R4}{R3 + R4} VDD.$$

This is a voltage that is relevant of the voltage of the working power supply. In this embodiment, the VDD is the working power supply of the VCO circuit.

Step 720: After being amplified, the voltage is output as variable bias voltage.

Referring to FIG. 8, the VREF is inputted to the positive input end of the calculation amplifier 801. The negative input end of the calculation amplifier 801 is grounded through the first resistance R5. The output end of the calculation amplifier 801 is reversely connected to the negative input end of the calculation amplifier through the second resistance R6 to construct a negative feedback loop. According to the working principles of a calculation amplifier, the calculation amplifier 801 in FIG. 8 amplifies the input voltage VREF and then outputs the voltage.

Suppose that the electric potential between first resistance R5 and second resistance R6 is V0. That is, the electric potential at the negative input end of the calculation amplifier 801 is V0. Due to the existence of the negative feedback loop of the calculation amplifier 801, V0 is equal to VREF, and the input current at the negative input end is approximately 0. The current that passes through the first resistance R5 is equivalent with the current that passes through the second resistance R6, that is, $$\frac{V0}{R5}.$$

The output voltage of the calculation amplifier 801 is calculated as follows:

$$VOUT = \frac{V0}{R5}(R5+R6) = \frac{R5+R6}{R5}VREF = \frac{R5+R6}{R5} * \frac{R4}{R3+R4}VDD.$$

After the values of R3, R4, R5, and R6 are properly set, the VOUT can vary with the VDD, and the change proportion can be flexibly set according to the actual requirement. The VOUT is output as bias voltage.

Step 730: The voltage of the power supply of the VCO circuit is compensated by using the variable bias voltage.

The output voltage VOUT shown in FIG. 8 is sent to the VBIAS input end of the VCO circuit shown in FIG. 3. When the working power supply VDD of the VCO circuit is changed by ΔV, the change to the $$VOUT \text{ is } \frac{R5+R6}{R5} * \frac{R4}{R3+R4}\Delta V.$$

The output frequency of the VCO circuit is the function for the VBIAS, so proper compensation for the VBIAS input can help compensate the impact of the change to the voltage of the power supply on the VCO frequency.

The method in this embodiment can help compensate the impact of changes to the voltage of the power supply on the oscillation frequency of the VCO and make the VCO to obtain a broad output frequency range when the input voltage range is fixed, thus improving the stability of the oscillation frequency in the VCO system.

The method in this embodiment can be applied in other circuit systems with bias voltage input ends where the voltage of the power supply is subject to changes during the operation. The device in this embodiment can help improve the stability of these circuit systems.

Fourth Embodiment

Figure 9:
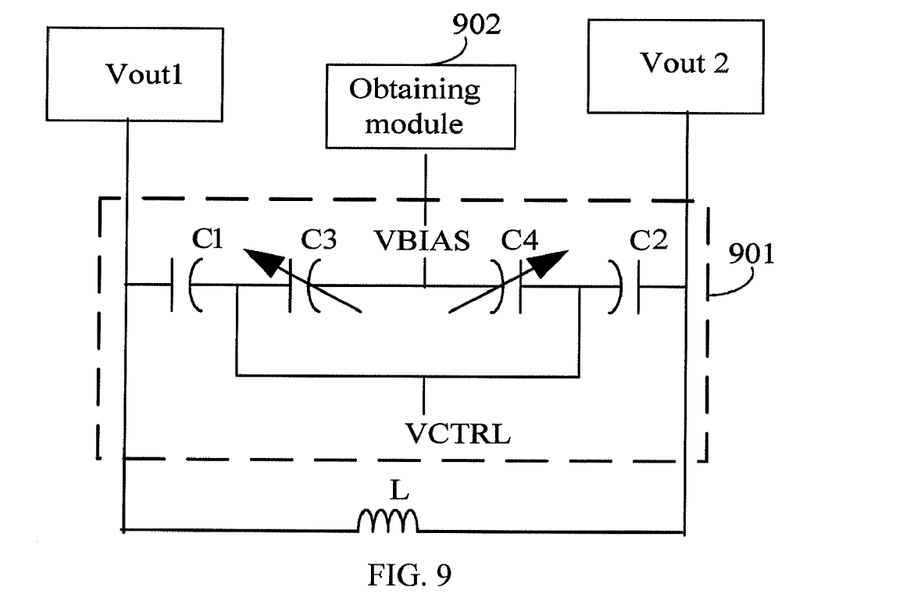
FIG. 9 is a device for a method for compensating an oscillation frequency in a fourth embodiment of the present disclosure.

A device for compensating an oscillation frequency is provided in an embodiment of the present disclosure as shown in FIG. 9. The device includes:

a generating module 901, including an LC oscillating loop that includes at least one variable capacitor, configured to send a voltage control signal to one end of the variable capacitor to generate oscillation signals in the LC oscillating loop according to the voltage control signals.

an obtaining module 902, configured to: obtain a variable bias voltage that reflects changes of external parameters; and send the variable bias voltage to the other end of the variable capacitor to compensate changes to the oscillation frequency of oscillation signals generated in the LC oscillating loop.

Whereas, the LC oscillating loop includes at least one variable capacitor. Vout1 and Vout2 are output ends of the LC oscillating loop.

The device in this embodiment compensates the changes to the oscillation frequency of the circuit that contains the LC oscillating loop and improves the stability of the circuit oscillation frequency by sending bias voltage that reflects changes of external parameters to one end of the variable capacitor of the LC oscillating loop.

Figure 10:
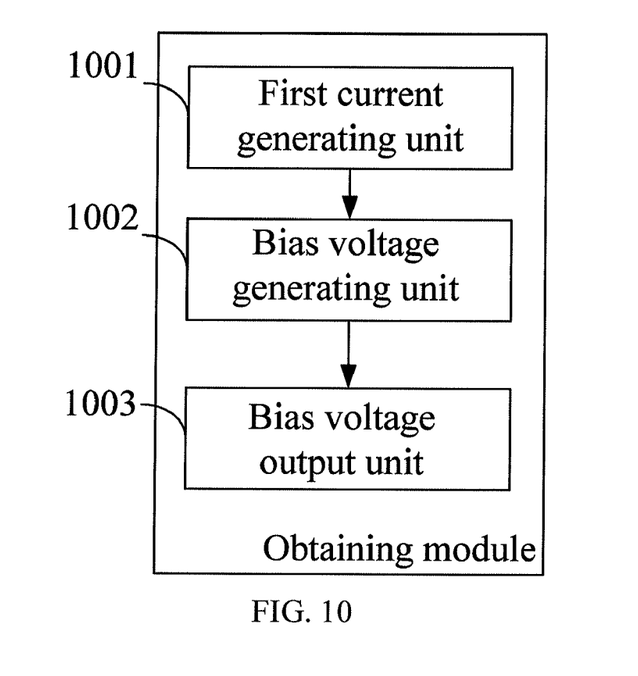
FIG. 10 shows a structure of an obtaining module in the fourth embodiment of the present disclosure.

As shown in FIG. 10, the obtaining module 902 may include:

a first current generating unit 1001, configured to generate a first current that reflects the first temperature coefficient;

a bias voltage generating unit 1002, configured to make the first current to pass through the resistance with the first temperature coefficient; and a bias voltage output unit 1003, configured to: output the voltage at both ends of the resistance as variable bias voltage; and send the variable bias voltage to the other end of the variable capacitor to compensate changes to the oscillation frequency of the oscillation signals generated in the LC oscillating loop.

As shown in FIG. 5, the obtaining module 902 includes; a calculation amplifier 502 that includes at least a positive input end and a negative input end; the grid of a first field effect tube 503 and the grid of a second field effect tube 501 that are connected to the output ends of the calculation amplifier 502. The source of the first field effect tube 503 and the source of the second field effect tube 501 are connected to a voltage source VDD at the same voltage. The drain of the first field effect tube 503 is connected to a reference voltage grounding line through the first resistance R1. The drain of the second field effect tube 501 is connected to the reference voltage grounding line through the second resistance R2 and. One input end of the calculation amplifier 502 is connected to the drain of the second field effect tube 501. The other input end of the calculation amplifier 502 is connected to the benchmark voltage VBG (a constant) that is irrelevant of the temperature. Whereas, the VDD can be the working power supply of the VCO circuit. The voltage at both ends of the first resistance R1 is output as variable bias voltage. To ensure that the field effect tube 501 and the calculation amplifier 502 construct a negative feedback loop, the drain of the second field effect tube 501 must be connected to the positive input end of the calculation amplifier 502 if the second field effect tube 501 is a positive field effect tube; or the drain of the second field effect tube 501 must be connected to the negative input end of the calculation amplifier 502 if the second field effect tube 501 is a negative field effect tube.

Further, the first current generating unit 1001 includes a first field effect tube 503, a second field effect tube 501, and a resistance R2 that reflects the second temperature coefficient.

The drain of the second field effect tube 501 is grounded through the resistance R2 of a second temperature coefficient to obtain a second current I2 that reflects the first temperature coefficient.

The source of the first field effect tube 503 is directly connected to the VDD. The grid of the first field effect tube 503 is connected to the grid of the second field effect tube 501. In this case, the drain of 503 obtains a first current I1 that reflects the first temperature coefficient. The first current I1 varies in the same direction with the second current I2.

The electric potential at the drain of the second field effect tube 501 is irrelevant of the temperature. If the first temperature coefficient is a PTC, the second temperature coefficient is an NTC; if the first temperature coefficient is an NTC, the second temperature coefficient is a PTC.

In this embodiment, the second field effect tube 501 is a positive field effect tube. To implement a negative feedback loop in FIG. 5, the drain of the second field effect tube 501 must be connected to the positive input end of the calculation amplifier 502. Due to the existence of this negative feedback loop, the electric potential at the positive input end is approximately the same as the electric potential at the negative input end of the calculation amplifier 502. In addition, the positive input end of 502 is directly connected to the drain of 501. Therefore, the electric potential at the drain of 501 is considered equivalent with the electric potential at the negative input end of 502. The negative input end of 502 is connected to the benchmark voltage VBG that is irrelevant of temperature. Therefore, the electric potential at the drain of the second field tube is irrelevant of temperature.

Referring to FIG. 5, the grid of 503 is connected to the grid of 501 at a same electric potential. As the circuit principles state, the first current I1 obtained by the drain of 503 varies in the same direction with the second current I2. In addition, the ratio of I1 to I2 is the ratio of the size of 503 to the size of 501. The second current I2 reflects the first temperature coefficient, that is, a PTC. Therefore, the first current I1 reflects the first temperature coefficient.

Likewise, if the second current I2 reflects an NTC, the first current I1 reflects an NTC.

The bias voltage generating unit 1002 is configured to make the first current to pass through the resistance of the first temperature coefficient.

Referring to FIG. 5, the drain of the first field effect tube 503 is grounded through the resistance R2 of the first temperature coefficient, that is, a PTC. Therefore, the first current I1 passes through the first temperature coefficient, that is, the resistance R2 of a PTC.

The bias voltage output unit 1003 is configured to output the voltage at both ends of the resistance as variable bias voltage, and send the variable bias voltage to the other end of the variable capacitor to compensate changes to the oscillation frequency of the oscillation signals generated in the LC oscillating loop.

Referring to FIG. 5, the voltage VOUT at both ends of the resistance R2 of the first temperature coefficient is output as variable bias voltage. The first current I1 and resistance R2 reflect the first temperature coefficient, that is, a PTC. Therefore, the voltage VOUT at both ends of R2 reflects the first temperature coefficient, that is, a PTC.

The output voltage VOUT shown in FIG. 5 is sent by the obtaining module 902 to the VBIAS input end of the VCO circuit shown in FIG. 3. Take FIG. 3 (*a*) as an example. If the voltage VCTRL at ends of variable capacitors C3 and C4 reflects a PTC, the voltage VBIAS that reflects a PTC is input to maintain the voltage at both ends of C3 and both ends of C4, thus reducing the changes to the output frequency due to impact of the temperature in the VCO circuit. Likewise, if the voltage VCTRL at ends of variable capacitors C3 and C4 reflect an NTC, a VBIAS that reflects an NTC is compensated.

The device for compensating an oscillation frequency in this embodiment can help compensate the impact of temperature changes on the oscillation frequency of the VCO and make the VCO to obtain a broad output frequency range, thus improving the stability of the oscillation frequency.

The device in this embodiment is applicable to the VCO circuit and other circuits that have bias voltage input and are affected by temperature changes.

Fifth Embodiment

Figure 11:
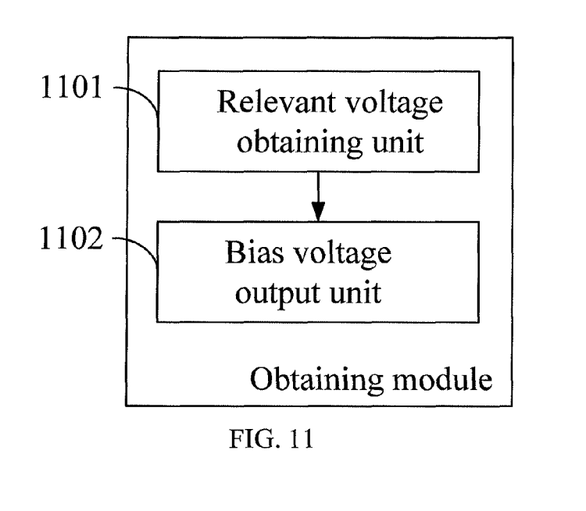
FIG. 11 shows a structure of an obtaining module in a fifth embodiment of the present disclosure.

This embodiment provides another device for compensating the oscillation frequency. The generating module 901 is similar to that in the fourth embodiment. The obtaining module 902 is shown in FIG. 11. The obtaining module 902 can include a relevant voltage obtaining unit 1101, and a bias voltage output unit 1102.

The relevant voltage obtaining unit 1101 is configured to obtain a voltage that is relevant of the voltage of the working power supply by using the voltage division circuit.

In FIG. 8, the VDD is grounded through the resistance R3 and R4. R3 and R4 construct a voltage division circuit. Therefore, the electric potential between R3 and R4 can be calculated as follows:

$$VREF = \frac{R4}{R3+R4}VDD.$$

This is a voltage that is relevant of the voltage of the working power supply. In this embodiment, the VDD is the working power supply of the VCO circuit.

The bias voltage output unit 1102 is configured to output the voltage at both ends of the resistance as variable bias voltage after voltage amplification, and send the variable bias voltage to the other end of the variable capacitor to compensate changes to the oscillation frequency of the oscillation signals generated in the LC oscillating loop.

Referring to FIG. 8, the VREF is inputted to the positive input end of the calculation amplifier 801. The negative input end of the calculation amplifier 801 is grounded through the first resistance R5. The output end of the calculation amplifier 801 is reversely connected to the negative input end of the calculation amplifier through the second resistance R6 to construct a negative feedback loop. According to the working principles of a calculation amplifier, the calculation amplifier 801 in FIG. 8 amplifies the input voltage VREF and then outputs the voltage as the variable bias voltage.

Suppose that the electric potential between first resistance R5 and second resistance R6 is V0. That is, the electric potential at the negative input end of the calculation amplifier 801 is V0. Due to the existence of the negative feedback loop of the calculation amplifier 801, V0 is equal to VREF, and the input current at the negative input end is approximately 0. The current that passes through the first resistance R5 is equivalent with the current that passes through the second resistance R6, that is, $$\frac{V0}{R5}.$$

The output voltage of the calculation amplifier 801 is calculated as follows:

$$VOUT = \frac{V0}{R5}(R5+R6) = \frac{R5+R6}{R5}VREF = \frac{R5+R6}{R5} * \frac{R4}{R3+R4}VDD.$$

After the values of R3, R4, R5, and R6 are properly set, the VOUT can vary with the VDD, and the change proportion can be flexibly set according to the actual requirement. The VOUT is output as bias voltage.

The output voltage VOUT shown in FIG. 8 is sent by the obtaining module 902 to the VBIAS input end of the VCO circuit shown in FIG. 3. When the working power supply VDD of the VCO circuit is changed by ΔV, the change to the VOUT is ΔV. The output frequency of the VCO circuit is the function for the VBIAS, so proper compensation for the VBIAS input can help compensate the impact of the change to the voltage of the power supply on the VCO frequency.

The device in this embodiment can help compensate the impact of changes to the voltage of the power supply on the oscillation frequency of the VCO and make the VCO to obtain a broad output frequency range when the input voltage range is fixed, thus improving the stability of the oscillation frequency in the VCO system.

The device in this embodiment can be applied in other circuit systems that have bias voltage input ends and where voltage of the power supply is subject to changes during operation.

Sixth Embodiment

Figure 12:
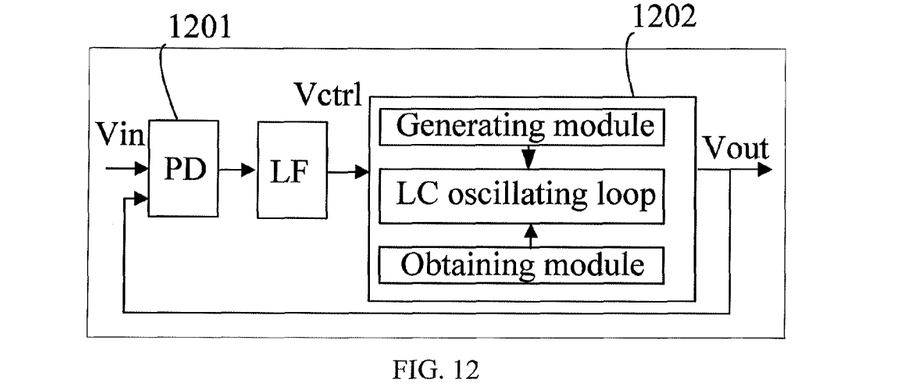
FIG. 12 shows a structure of a PLL in a sixth embodiment of the present disclosure.

A PLL (Phase-Locked Loop) is provided in an embodiment of the present disclosure, as shown in FIG. 12. The PLL includes a PD (phase detector) 1201, an LF (low pass filter), and a VCO (Voltage Controlled Oscillator) 1202. Vin is the input voltage of the VLL. The output voltage Vctrl of the LF is the input voltage for the VCO 1202. The output voltage Vout of the VCO 1202 is the output voltage of the PLL.

The PD detects the phase difference between input voltage Vin and output voltage Vout of the PLL, and converts the detected phase difference signals into voltage signals. The voltage signals are sent to the VCO as a voltage control signals (Vctrl for the VCO) after being filtered by the LF. These voltage control signals are adapted by the input voltage to control the frequency of the oscillation signals exported by the VCO.

The VCO 1202 includes:

an LC oscillating loop that includes at least one variable capacitor;

a generating module, configured to send voltage control signals to one end of a variable capacitor of the LC oscillating loop to generate oscillating signals in the LC oscillating loop through the voltage control signals; and an obtaining module, configured to: obtain variable bias voltage that reflects changes of external parameters; and send the variable bias voltage to the other end of the variable capacitor to compensate changes to the oscillation frequency of oscillation signals generated in the LC oscillating loop.

When external parameter changes indicate temperature parameter changes, the obtaining module can include:

a first current generating unit, configured to generate a first current that reflects the first temperature coefficient;

a bias voltage generating unit, configured to make the first current to pass through the resistance of the first temperature coefficient; and a bias voltage output unit, configured to: output the voltage at both ends of the resistance as variable bias voltage; and send the variable bias voltage to the other end of the variable capacitor to compensate changes to the oscillation frequency of the oscillation signals generated in the LC oscillating loop.

The first temperature coefficient can be a PTC or an NTC.

This obtaining module is described in the fourth embodiment of the present disclosure and thus not repeated here.

Or, the obtaining module can include:

a relevant voltage obtaining unit, configured to obtain a voltage that is relevant of the voltage of the working power supply by using the voltage division circuit; and a bias voltage output unit, configured to: output the voltage at both ends of the resistance as variable bias voltage; and send the variable bias voltage to the other end of the variable capacitor to compensate changes to the oscillation frequency of the oscillation signals generated in the LC oscillating loop.

This obtaining module is described in the fifth embodiment of the present disclosure and thus not repeated here.

The method provide in an embodiment of the present disclosure involves sending variable bias voltage that reflects changes to external parameters from one end of a variable capacitor of an LC oscillating loop to compensate the changes to the oscillation frequency of the circuit that contains the LC oscillating loop. This method helps reduce the risks of out-of-lock of the PLL when the external parameters such as the voltage and temperature of the power supply change radically. In addition, this method helps obtain a broad output frequency range and improve the system reliability when the VCO input voltage range is fixed, thus improving the stability of the PLL.

This disclosure can be implemented by using a software program. The software program can be stored in a readable storage device, such as the hard disk, buffer, and compact disk of a computer.

The preceding embodiments are intended to illustrate but not to confine the present disclosure. The disclosure is intended to cover all the modifications, equivalent replacements, and improvements without departing from the spirit and principles of the disclosure.

What is claimed is:

1. A device for compensating an oscillation frequency, comprising:

a generating module, configured to send a voltage control signal to one end of a variable capacitor of an LC oscillating loop to generate oscillating signals in the LC oscillating loop; and an obtaining module, configured to obtain a variable bias voltage reflecting changes of external parameters and send the variable bias voltage to the other end of the variable capacitor to compensate changes to the oscillation frequency of oscillation signals generated in the LC oscillating loop;

wherein the changes of external parameters comprise the changes of the voltage parameters of the power supply, and the obtaining module further comprises:

a relevant voltage obtaining unit, configured to obtain a relevant voltage that is relevant of the voltage of the working power supply according to a voltage division circuit; and a bias voltage output unit, configured to amplify the relevant voltage and output the amplified voltage as the variable bias voltage, and send the variable bias voltage to the other end of the variable capacitor to compensate changes to the oscillation frequency of the oscillation signals generated in the LC oscillating loop, wherein the bias voltage output unit further comprises a calculation amplifier, a first resistance, and a second resistance, and the amplified voltage is inputted to a positive input end of the calculation amplifier, a negative input end of the calculation amplifier is grounded through the first resistance, an output end of the calculation amplifier is connected to the negative input end of the calculation amplifier through the second resistance to construct a negative feedback loop, and the output end of the calculation amplifier outputs the amplified voltage as the variable bias voltage.

2. A method for compensating an oscillation frequency, applied in an LC oscillating loop comprising:
sending a voltage control signal to one end of a variable capacitor of the LC oscillating loop to generate oscillating signals in the LC oscillating loop according to the voltage control signals;
obtaining a variable bias voltage reflecting changes of external parameters; and
sending the variable bias voltage to the other end of the variable capacitor to compensate changes to the oscillation frequency of oscillation signals generated in the LC oscillating loop;
wherein the changes of external parameters are the changes of the voltage parameters of the power supply, and the method further comprises:
obtaining a relevant voltage that is relevant of the voltage of the working power supply according to a voltage division circuit; and
amplifying the relevant voltage outputting the amplified voltage as the variable bias voltage,
wherein outputting the amplified voltage as the variable bias voltage further comprises:
inputting the voltage to a positive input end of a calculation amplifier, setting the negative input end of the calculation amplifier grounded through a first resistance;
setting the output end of the calculation amplifier connected to the negative input end of the calculation amplifier through a second resistance to construct a negative feedback loop; and
outputting the amplified voltage by the output end of the of the calculation amplifier as the variable bias voltage.

3. The method according to claim 2, wherein the LC oscillating loop is used in a Voltage Controlled Oscillator.

4. A Phase Locked Loop for compensating the oscillation frequency, comprising: a phase detector, a low pass filter, and a voltage controlled oscillator, wherein
the phase detector is configured to detect the phase difference between input voltage and output voltage, and convert the detected phase difference signals into a voltage signal;
the low pass filter is configured to filter the voltage signal and send the filtered voltage signal to the voltage controlled oscillator as a voltage control signal; and
the voltage controlled oscillator comprises an LC oscillating loop that comprises at least one variable capacitor;
wherein the voltage control signal is sent to one end of a variable capacitor in the LC oscillating loop to generate a oscillation signal in the LC oscillating loop, and a variable bias voltage reflecting changes of external parameters is sent to the other end of the variable capacitor to compensate changes to the oscillation frequency of the oscillation signal generated by the LC oscillating loop;
wherein the changes of external parameters are the changes of the voltage parameters of the power supply, and the voltage controlled oscillator further comprises:
a relevant voltage obtaining unit, configured to obtain a relevant voltage that is relevant of the voltage of the working power supply according to a voltage division circuit; and
a bias voltage output unit, configured to amplify the relevant voltage and output the amplified voltage as the variable bias voltage, and send the variable bias voltage to the other end of the variable capacitor to compensate the changes to the oscillation frequency of the oscillation signal generated in the LC oscillating loop,
wherein the bias voltage output unit further comprises a calculation amplifier, a first resistance, and a second resistance, and the amplified voltage is inputted to a positive input end of the calculation amplifier, a negative input end of the calculation amplifier is grounded through the first resistance, an output end of the calculation amplifier is connected to the negative input end of the calculation amplifier through the second resistance to construct a negative feedback loop, and the output end of the calculation amplifier outputs the amplified voltage as the variable bias voltage.

* * * * *